(12) United States Patent
Koch et al.

(10) Patent No.: US 9,130,193 B2
(45) Date of Patent: Sep. 8, 2015

(54) ORGANIC LIGHT EMITTING DIODE DEVICES

(75) Inventors: Gene Koch, Pontypridd Mid Glamorgan (GB); Nigel Copner, Gwent (GB)

(73) Assignee: LOMOX LIMITED, Abercynon Mid Glamorgan (GB)

(*) Notice: Subject to any disclaimer, the term of this patent is extended or adjusted under 35 U.S.C. 154(b) by 48 days.

(21) Appl. No.: 13/822,240

(22) PCT Filed: Sep. 14, 2011

(86) PCT No.: PCT/EP2011/065971
§ 371 (c)(1),
(2), (4) Date: May 21, 2013

(87) PCT Pub. No.: WO2012/035083
PCT Pub. Date: Mar. 22, 2012

(65) Prior Publication Data
US 2013/0228759 A1    Sep. 5, 2013

(30) Foreign Application Priority Data

Sep. 15, 2010   (GB) .................................. 1015417.7

(51) Int. Cl.
| H01L 29/08 | (2006.01) |
| H01L 35/24 | (2006.01) |
| H01L 51/00 | (2006.01) |
| H01L 51/52 | (2006.01) |
| H01L 51/50 | (2006.01) |

(52) U.S. Cl.
CPC ........ H01L 51/5265 (2013.01); H01L 51/5262 (2013.01); *H01L 51/5012* (2013.01); *H01L 51/5048* (2013.01)

(58) Field of Classification Search
USPC .............................. 257/13, 40, 79–103, 918, 257/E51.018–E51.022, E33.001–E33.077, 257/E33.054, E25.028, E25.032, 252–254, 257/257–258, 642–643, 759, E39.007, 257/E51.001–E51.052, E27.117; 438/22–47, 69, 493, 503, 507, 956; 385/37

See application file for complete search history.

(56) References Cited

U.S. PATENT DOCUMENTS

| 6,967,437 B1 | 11/2005 | Samuel et al. |
| 7,075,229 B2 | 7/2006 | Lambertini et al. |
| 2004/0069995 A1* | 4/2004 | Magno et al. ................... 257/80 |

(Continued)

FOREIGN PATENT DOCUMENTS

| EP | 1385041 | 1/2004 |
| WO | 0070691 | 11/2000 |
| WO | 2005057675 | 6/2005 |

OTHER PUBLICATIONS

International Search Report for PCT/EP2011/065971, Completed by the European Patent Office on Jan. 26, 2012, 3 Pages.

*Primary Examiner* — Dao H Nguyen
*Assistant Examiner* — Tram H Nguyen
(74) *Attorney, Agent, or Firm* — Brooks Kushman P.C.

(57) ABSTRACT

A non-coherent light emitting device having at least one organic light emitting or organic charge transporting layer and a structure providing a Bragg grating associated with the light emitting layer is described. The organic light emitting layer having liquid crystalline material is treated to provide alternating zones of isotropic and liquid crystalline material. The combination of alternating zones with the dichroic effects of the aligned zone produces a pseudo 2-D Bragg grating within the light emitting layer.

30 Claims, 7 Drawing Sheets

(56) References Cited

U.S. PATENT DOCUMENTS

2007/0096078 A1* 5/2007 Lee et al. .................. 257/14
2007/0254208 A1 11/2007 Kurt et al.
2013/0163828 A1* 6/2013 Seiler ........................ 382/112
2013/0163928 A1* 6/2013 Wang et al. ................ 385/37
2013/0181195 A1* 7/2013 Cho et al. ................... 257/40
2013/0299792 A1* 11/2013 Park et al. .................. 257/40

* cited by examiner

ORGANIC LIGHT EMITTING DIODE DEVICES

CROSS-REFERENCE TO RELATED APPLICATION

This application is the U.S. national phase of PCT Appln. No. PCT/EP2011/065971 filed on Sep. 14, 2011, which claims priority to GB Patent Application No. 1015417.7 filed on Sep. 15, 2010, the disclosures of which are incorporated in their entirety by reference herein.

FIELD OF INVENTION

This invention relates to electroluminescent devices and in particular to electroluminescent devices base on organic light emitting diodes (OLEDs).

BACKGROUND ART

A well-known problem with currently manufactured organic light emitting diodes (OLEDs) is that the efficiency of the process by which they convert electrical energy into light is greatly compromised by loses of light inside the devices. In these devices the molecules of organic light emitting material in a light emitting layer emit light more or less uniformly in all directions. Light emitted at off vertical angles is trapped inside the device and eventually absorbed through the same process of total internal reflection utilised in light pipes and optical fibres. In general over 50% of light emitted is lost in this way. If this light could either be recovered or its emission suppressed then the efficiency of OLEDs would be greatly improved and the energy efficiency of OLEDs could be made to be much higher than that of currently known light sources and electronic displays.

One potential approach to limiting the amount of light emitted in the plane of the OLED devices and thus increasing their efficiency is to utilise liquid crystalline OLED emitter materials. These materials have long, rod-like molecular cores defining a long axis along the core length. As a result of their shape they are highly dichroic. That is to say, in each molecule most of the generated light is emitted along axes that are perpendicular to the long axis of the molecule, with very little light being emitted in the direction parallel to the long axis. Thus if a liquid crystalline emitter material is deposited to form the OLED light emitting layer with its molecular cores parallel to the plane of the device i.e. in-plane (as is most often the case) the amount of light emitted in-plane will be decreased as compared to the amount emitted perpendicularly to this plane.

Unfortunately liquid crystalline OLED materials exhibit a countervailing effect. The long molecular axes of these materials leads to their having an unusually high refractive index for light polarised with its axis of polarisation parallel to the molecular long axis. This increases the effective in-plane refractive index of the material leading to increased internal reflection and more light capture in the device plane, reducing efficiency.

Hitherto no suitable electroluminescent device structure has been found or method that effectively overcomes this problem associated with OLED structures and in particular structures based on liquid crystalline OLED materials.

DISCLOSURE OF THE INVENTION

According to the present invention a structure and it's method of manufacture has been found which enables the efficiency of electroluminescent device structures based on OLED materials, and in particular structures based on liquid crystalline OLED materials, to be improved. An electroluminescent device structure has been found that suppresses nearly all in-plane light emissions. Such an electroluminescent device is arranged to incorporate the combination of a highly dichroic light emitting material and a structure providing a Bragg grating associated with the light emitting layer.

Thus the present invention provides a non-coherent light emitting device comprising at least one organic light emitting or organic charge transporting layer and a structure providing a Bragg grating associated with the light emitting layer. Preferably, the Bragg grating structure provides a 1-D Bragg grating associated with the light emitting layer. Preferably, the light emitting or charge transporting layer comprises liquid crystalline material. The associated 1-D Bragg grating may be provided by alternating zones of isotropic and liquid crystalline material in the light emitting layer. The Bragg grating may be provided in a layer proximate to the light emitting layer so as to allow strong interaction between the grating layer and the emitter material in the light emitting layer.

The present invention further provides an electroluminescent device comprising at least one organic light emitting or organic charge transporting layer comprising liquid crystalline material wherein the liquid crystalline material layer comprises a photonic band gap effect.

In a preferred embodiment the molecular cores of the liquid crystalline material are uniformly aligned within the device and ideally alignment of the molecular cores is in the plane of the light emitting device. More preferably the alignment of the molecular cores is in the plane of the light emitting device and parallel to the zone boundaries in the layer in which they are contained.

In a preferred arrangement the at least one of the isotropic or liquid crystalline zones is a cross-linked polymer.

The liquid crystalline material, when uniformly aligned, is preferably dichroic in nature with a dichroic ratio in excess of 2:1. The alternating zones of isotropic and liquid crystalline material when present may have a uniform period of alternation over a distance equivalent to at least 20 zones. This uniform period of alternation is preferably within ±20% of $k\lambda/2$, where $\lambda$ is the wavelength of maximum emission intensity of the light emitting material of the light emitting device. It is preferred that the light emission in the plane of the device is suppressed by the combination of dichroism in the emitting material and the suppression of light propagation modes through the medium of alternating isotropic and liquid crystalline zones.

It has been found that the effectiveness of the device may be further enhanced if the organic light emitting or organic charge transporting layer comprises a regular two-dimensional matrix array of areas of liquid crystalline material surrounded by an area of isotropic material.

In a further aspect therefore the present invention provides a non-coherent light emitting device comprising at least one organic light emitting or organic charge transporting layer and a structure providing a Bragg grating associated with the light emitting layer, wherein the aforesaid light emitting or charge transporting layer comprises a regular two-dimensional matrix array of areas of liquid crystalline material surrounded by an area of isotropic material. Preferably, the Bragg grating structure provides a 1-D Bragg grating associated with the light emitting layer. The areas of liquid crystalline material may be square or rectangular in shape. The areas of liquid crystalline material are in the shape of rhombuses or parallelograms. The areas of liquid crystalline material are circular or oval in shape. The two-dimensional matrix may be a square matrix. The two-dimensional matrix may be an octagonal matrix. The regular two-dimensional matrix may be extant in a plane parallel to the plane of the device. The regular two-dimensional matrix may be extant in a plane perpendicular to the plane of the device. The liquid crystalline material, when uniformly aligned, may be dichroic in nature with a dichroic ratio in excess of 2:1.

In this aspect the alternation between isotropic and liquid crystalline material in the regular two-dimensional matrix interacts with the pattern of material layers in the light emitting device so as to localise light in the light emitting layer of the device. The light emission in the plane of the device may be suppressed by the combination of dichroism in the emitting material and the suppression of light propagation modes through the medium of alternating isotropic and liquid crystalline areas. The alternation between isotropic and liquid crystalline material along an axis in the plane of the two-dimensional matrix may be within ±20% of $k\lambda/2$, where $\lambda$ is the wavelength of maximum emission intensity of the light emitting material of the light emitting device.

It has been found that the effectiveness of the device may be further enhanced if the organic light emitting or organic charge transporting layer comprises a regular two-dimensional matrix array of areas of liquid crystalline material surrounded by an area of isotropic material.

Thus in a further aspect the present invention provides a non-coherent light emitting device comprising at least one organic light emitting or organic charge transporting layer wherein the aforesaid light emitting or charge transporting layer comprises a regular three-dimensional matrix array of zones of liquid crystalline material surrounded by and interspersed in isotropic material. The zones may take the form of cubes, rectangular cuboids, or parallelipipeds. The zones may take the form of cylinders, elliptic cylinders, spheres or ellipsoids. The matrix array may form either a simple cubic, a face-centered cubic or a hexagonal close-packed matrix lattice. In this aspect the liquid crystalline material, when uniformly aligned, may be dichroic in nature with a dichroic ratio in excess of 2:1.

With this arrangement in this aspect the alternation between isotropic and liquid crystalline material in the regular three-dimensional matrix interacts with the pattern of material layers in the light emitting device so as to localise light in the light emitting layer of the device. The light emission in the plane of the device is suppressed by the combination of dichroism in the emitting material and the suppression of light propagation modes through the medium of alternating isotropic matrix and liquid crystalline zones. The alternation between isotropic and liquid crystalline material along an axis through the two-dimensional matrix may be within ±20% of $k\lambda/2$, where $\lambda$ is the wavelength of maximum emission intensity of the light emitting material of the light emitting device.

The present invention further provides a method of manufacturing a layered electroluminescent device, which method comprises depositing an organic liquid crystalline emitter material as a layer, uniformly aligning the liquid crystal molecules' rod-like molecular cores within the layer, exposing selected regions of the aligned layer below the liquid crystal to isotropic phase transition temperature of the material to phase setting conditions in order to set the phase of the selected exposed regions, heating the layer comprising phase set regions above the material's liquid crystal to isotropic phase transition temperature to a second exposure to phase setting conditions. In a preferred embodiment the organic liquid crystalline emitter material is monomeric and may be polymerized by exposure to UV radiation; in this embodiment the polymerization sets the phase of the exposed regions to maintain their alignment and after the layer is raised above the material's liquid crystal to isotropic phase transition temperature the second exposure to UV sets the previously non-exposed regions in an amorphous state.

DESCRIPTION OF THE DRAWINGS

For a better understanding of the invention, and to show how the same may be carried into effect, reference will now be made, by way of example, to various specific embodiments of the invention as shown in the accompanying diagrammatic drawings, in which.

DETAILED DESCRIPTION OF THE INVENTION

In the present invention it has been found that by combining the effect of using a highly dichroic light emitting material and a Bragg grating strongly coupled to the light emitting layer there is no need to incorporate a 2-D Bragg grating, which is problematic. All that is required to achieve the desired effect is the combination.

Figure 1:
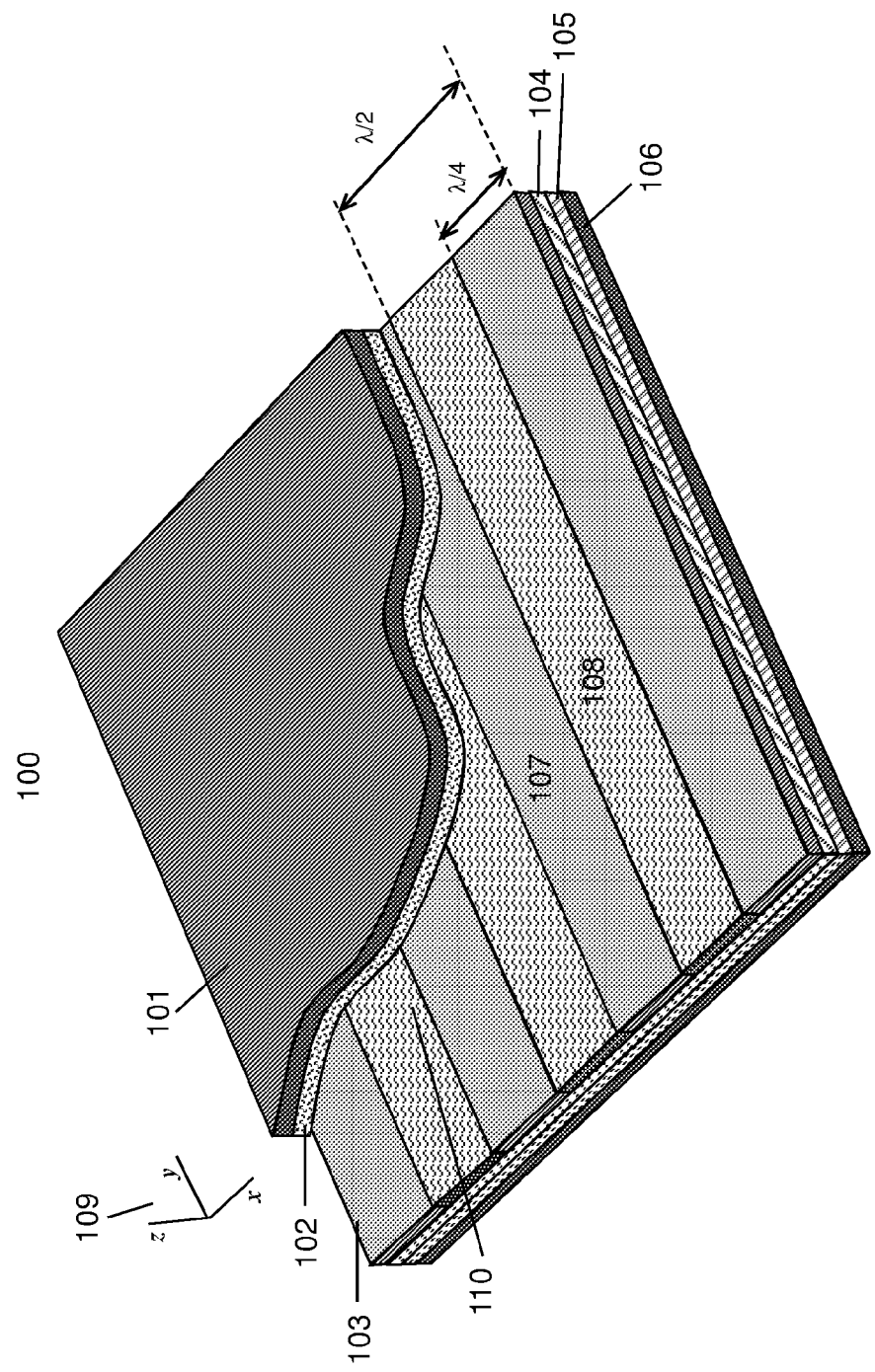
FIG. 1, shows in perspective view and section, an electroluminescent device according to the present invention.

With reference to FIG. 1, OLED device 100 has component layers typical for an OLED; for example, the cathode 101, an electron transporting layer 102, an emitter layer 103, a hole transporting layer 104, a hole injection layer 105, and an anode 106. However, in this OLED the emitter layer is composed of zones of high refractive index 107 and zones of low refractive index 108. These zones are of a configuration such that they form a Bragg grating of period $\lambda/2$ with the axis of maximum refractive index modulation in the x direction of Cartesian coordinate system 109. In addition the material of emitter layer 103 is selected such that it is highly dichroic with the extraordinary axis of dichroism in the direction of Cartesian coordinate y. That is to say the molecules of layer 103 tend to emit little light in the y direction, but much more light in the x and z directions. If the emission band of the emitter of layer 103 has its emission band fairly narrowly distributed about wavelength $\lambda$, the emission of light in the x direction will be suppressed by the photonic band gap phenomenon. At the same time the emitter material by its nature cannot emit light in the y direction. Nearly all light emitted by the material will be in the ±z directions.

Figure 2:
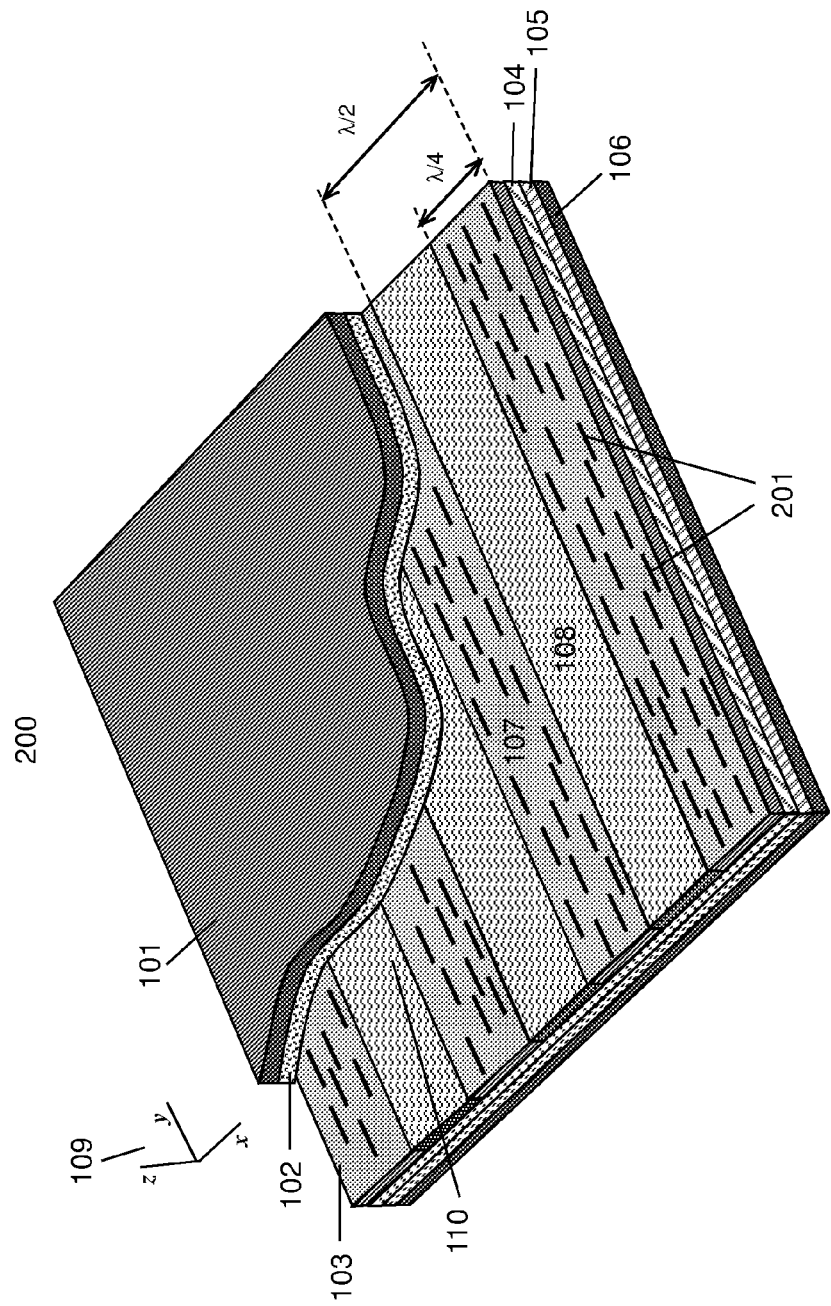
FIG. 2, shows in perspective view and section, an electroluminescent device according to the present invention incorporating aligned liquid crystalline material.

With reference to FIG. 2 as an OLED with this configuration may be practically implemented by causing the emitter material in layer 103 to be liquid crystalline in nature in zones 107 with the liquid crystal molecules' rod-like molecular cores 201 uniformly aligned with their long axes along the y axis. If the liquid crystal material is monomeric in nature when the layer is applied, the zones 107 may be polymerised to liquid crystalline polymer by exposure to UV radiation either as holographic fringes or through a phase mask. Then the layer can be heated above the material's liquid crystal to isotropic phase transition temperature and exposed to UV a second time. This results in the material in zones 108 being polymerised into an amorphous polymer with the chemical composition as zones 107, but with none of the liquid crystals birefringence. Light traversing layer 103 in the x direction sees the extraordinary refractive index of the liquid crystal which is generally quite high (above 2.0) when crossing through zones, but sees some average of the extraordinary and ordinary refractive indices of the liquid crystal (considerably lower) when traversing amorphous zones 108. Thus the requisite photonic band gap is formed.

An issue with device 200 in FIG. 2 is that if current flows through both zones 107 and 108, while little light from zones 107 will be emitted in direction y, zones 108 will emit light equally in all directions. Thus the goal of eliminating in-plane light emission will be partially defeated. There are two strategies for overcoming this problem.

The first strategy is to dope some amount of a non-polymerizable, insulating liquid crystalline material into the liquid crystalline monomer from which layer 103 is formed. When zones 107 are polymerised this dopant may be expelled into zones 108. After the subsequent heating and second UV exposure, the composition of zones 108 will be rich in dopant dissolved in a gel matrix of emitting material. This material will be less conductive than that in zones 107 and when current is applied to the OLED 200 current will almost entirely flow through the dichroic medium of zones 107 yielding the desired suppression of light emission. This doping can also serve to increase the refractive index modulation of the grating in 103 if the dopant is a relatively low refractive index material. Care must be taken that the dopant is sufficiently soluble in the amorphous emitter material polymer or phase separated inclusions of relatively pure dopant will be formed and scatter light in layer 103.

A second approach to the problem with device 200 is to locate the Bragg grating structure in a layer sufficiently near to layer 103 so as to allow strong interaction between the grating and the emitter material in layer 103. This obviates the need for the presence of a grating in layer 103 itself and allows the liquid crystalline material in this layer to be uniformly aligned such that its dichroism minimises light emission in the y direction. An example of such a structure is portrayed in FIG. 3. In this device layers 101, 104, 105, and 106 have the same function as in device 200. The emitter layer 301 is composed of a liquid crystalline emitter material whose rod-like molecular cores are aligned parallel to axis y of Cartesian coordinate system 109. Electron transporting layer 302 comprises zones 303 in which the material is liquid crystalline in nature with rod-like molecular cores 306 that are aligned parallel to axis y of Cartesian coordinate system 109, and zones 304 that are amorphous in nature. Light emitting material in layer 301 interacts with the Bragg grating structure in layer 302 so as to suppress light emission in directions parallel to the x-axis of Cartesian coordinate system 109. It is important to tune the extraordinary refractive index of zones 303 and the refractive index of zones 304 such that the interaction of the grating with the material in layer 301 is maximised.

Figure 3:
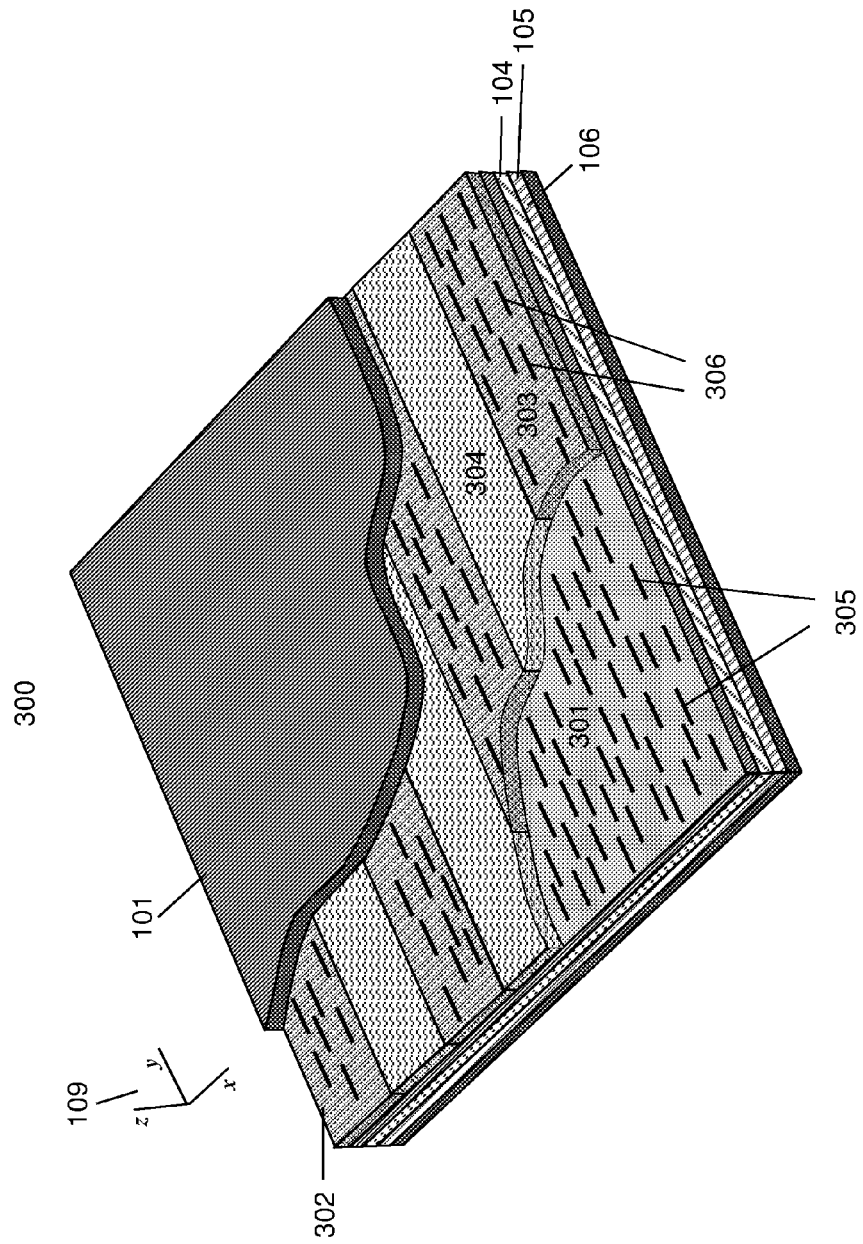
FIG. 3, shows in perspective view and section, an electroluminescent device according to the present invention incorporating aligned liquid crystalline material and a separate Bragg grating layer proximate to the emitting layer.
Figure 4:
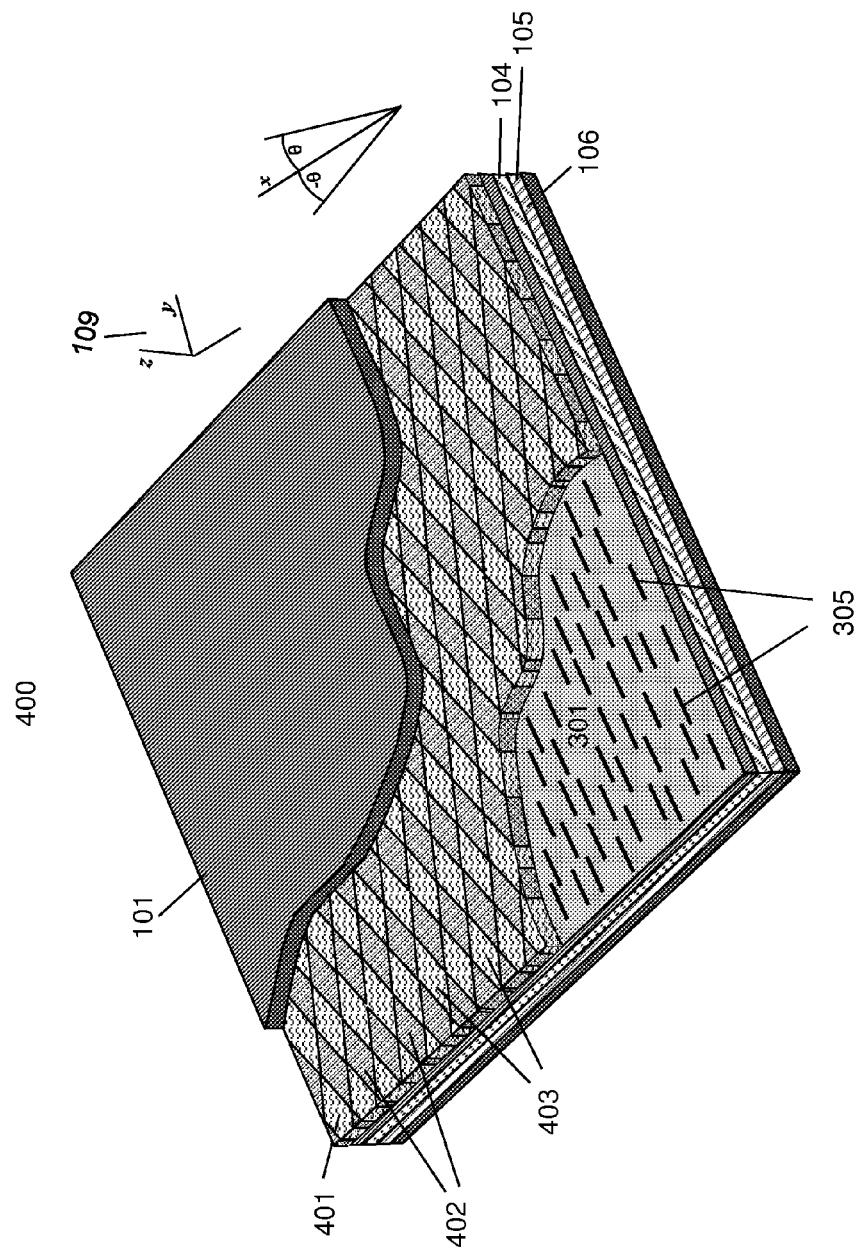
FIG. 4, shows in perspective view and section, an electroluminescent device according to the present invention incorporating a two-dimensional grating.

As mentioned above the photonic band gap will be complete over a particular range in the wavelength spectrum. This is known as the stop band of the grating. The stop band also has an angular extent. As light passing through the grating, for instance in FIG. 3, is directed at angles deviating further and further from the x-axis the strength and spectral extent of the stop band for light propagating at that particular angle decrease. Also, as might be predicted by geometry the center wavelength of the stop band is shifted to longer wavelengths. At some angle from the x-axis the stop band will disappear. This means that emission of light by the dichroic emitter at some angles intermediate between the x and y directions will not be suppressed. A potential solution for this issue is the use of two gratings, one of which would have its grating direction +θ degrees from the x-axis and the other with its grating direction −θ degrees from the x-axis. Combined together, two gratings in different directions in a material yield a two-dimensional grating. There are a number of two-dimensional grating configurations that could yield the desired effect. FIG. 4 portrays an example. In device 400 layers 101, 301, 104, 105, and 106 are the same as in FIG. 3. Electron transporting layer 401 contains diamond-shaped regions 402 in which the material is liquid crystalline in structure with the rod-like molecular cores of the liquid crystalline material oriented with their long axes along the y-axis of the Cartesian coordinate system. These diamond shaped regions 402 are interspersed with diamond-shaped regions 403 of amorphous material. The effect of this arrangement is as if there were two gratings in layer 401, one with its grating direction at x+θ degrees and the other at x−θ degrees. Thus the light emitting material of layer 301 interacts with photonic band gaps in both the x+θ and the x−θ directions and these band gaps overlap to create an angularly broad band gap over a band of angles centered on the x-axis.

Figure 5:
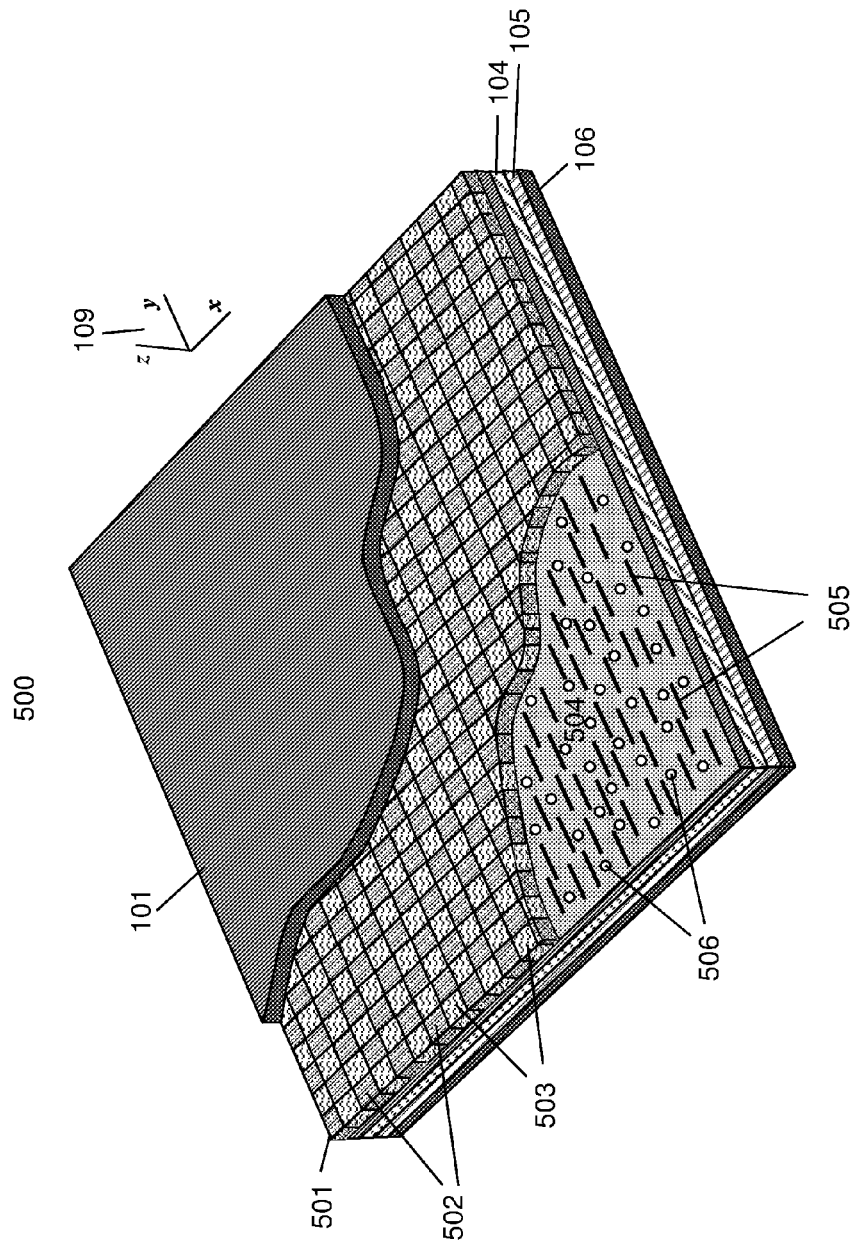
FIG. 5, shows in perspective view and section, an electroluminescent device according to the present invention incorporating a two-dimensional grating and dissolved isotropically emitting material in the emitting layer.

Another application for a similar two-dimensional grating is one in which the emitter material of layer 301 is has little or no dichroism. This would be the case if the emitter layer consisted of a liquid crystalline host in which is dissolved an isotropically emitting material. A device with this configuration is portrayed in FIG. 5. Layers 101, 104, 105, and 106 have the same functions as in previous embodiments. However, emitter layer 504 in this case consists of aligned liquid crystal molecular cores 505 in which are dissolved isotropically emitting emitter molecules 506. The liquid crystal molecular cores are aligned in the y direction of Cartesian coordinates 109. Electron transporting layer 501 contains square-shaped regions 502 in which the material is liquid crystalline in structure with the rod-shaped molecular cores of the material aligned in the y direction. These regions are interspersed with square-shaped regions 503 of amorphous material. This configuration has the effect of two gratings one of which interacts with light propagating in directions parallel to the y-axis and one of which interacts with light propagating in directions parallel to the x-axis. If the refractive indices of layer 501 and regions 502 and 503 are properly tuned (with extraordinary refractive indices of the liquid crystalline material in the two layer closely matched) the two-dimensional grating structure of layer 501 will interact strongly with the emitter molecules 506 suppressing light emission along both the x and y axes. It should clear that the square two-dimensional grating in layer 501 in this embodiment could also be located in the emitter layer 504 with similar effect.

Another potential issue for the embodiments of this invention is that of light propagating at angles intermediate between axes in the x,y plane of the devices and the z axis (towards the outside environment) may not be affected by a photonic band gap grating structure in the x,y plane. Depending on the critical angles at various interlayer interfaces in the device, a good deal of this light may not make into the outside environment.

A simple way to eliminate some of this stray light emission is to set the thickness of the light emitting layer (for instance layer 301 in device 300) such that reflections off from the top and bottom surfaces of this layer create a weak etalon effect. If the thickness is such that the internally reflected light along axes normal to plane of the device is in phase over multiple reflections, a standing wave is built up in the device. This light localisation creates feedback which narrows the angular distribution of emission about the z-axis thus decreasing the relative amount of light at off angles and eliminating some of the stray light problem.

Figure 6:
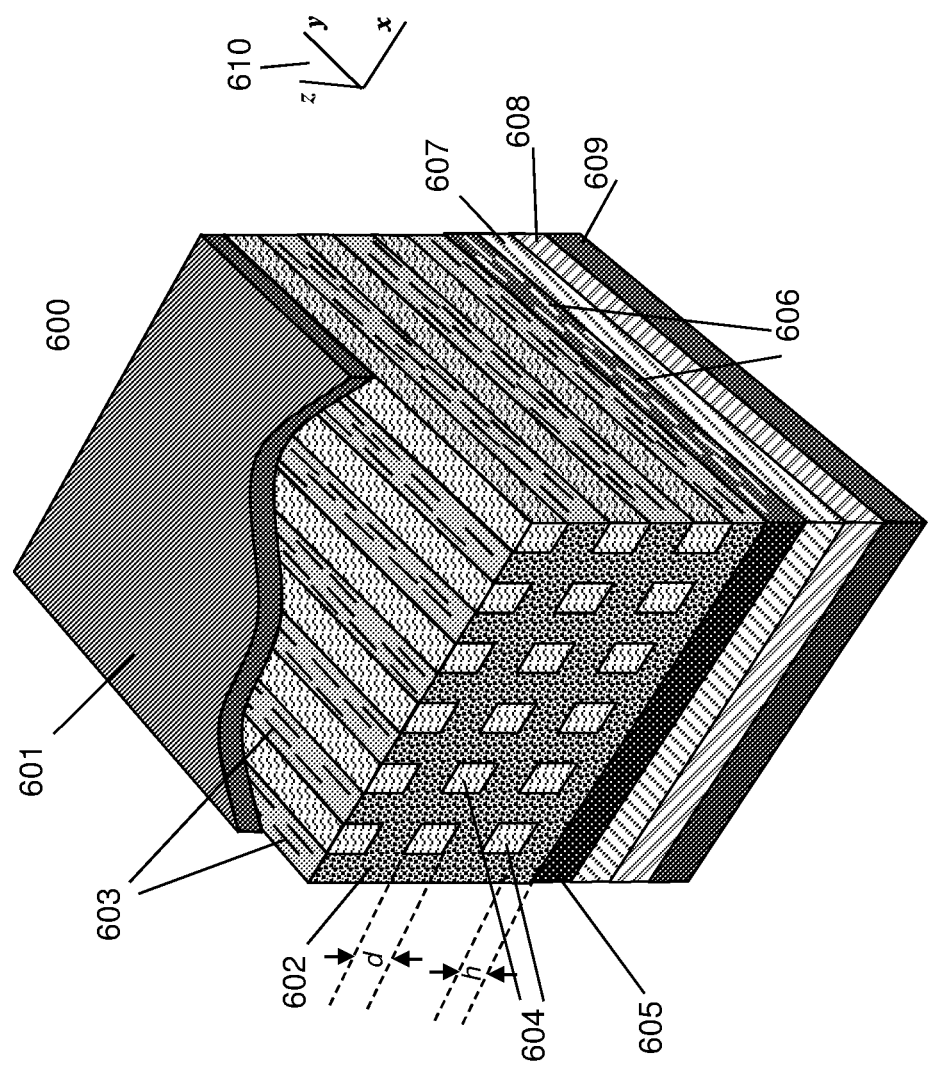
FIG. 6, shows in perspective view and section, an electroluminescent device according to the present invention incorporating a regular two-dimensional matrix array of areas of liquid crystalline material surrounded by an area of isotropic material.

In some cases it is helpful increase the level of feedback through the emitter layer. This may be done by introducing a two dimensional grating with maximum refractive index modulation along the x and z-axes. A device of this type is portrayed in FIG. 6. Here the cathode, hole transporting, hole injecting, and anode layers (601, 607, 608, and 609 respectively) function in much the same way as in previous embodiments. Emitter layer 605 is composed of material that is liquid crystalline in nature with rod-like molecular cores 606 that are aligned parallel to axis y of Cartesian coordinate system 610. Electron transporting layer 602 comprises a liquid crystalline material with rod-like molecular cores 606 that are also aligned along the y-axis. Included in layer 602 are regions of amorphous materials in the shape of rods of square cross-section that extend completely through the material of layer 602, and that have cross-sectional dimensions and are spaced such that they form a regular two-dimensional grating of pitch d. If dimension h is made to equal d, d may be selected so that the grating along the z-axis in layer 602 further localises light in the etalon formed by emitter layer 605. This further reduces the stray off-axis light emitted by the device further increasing the percentage of emitted light that leaves the device.

Figure 7:
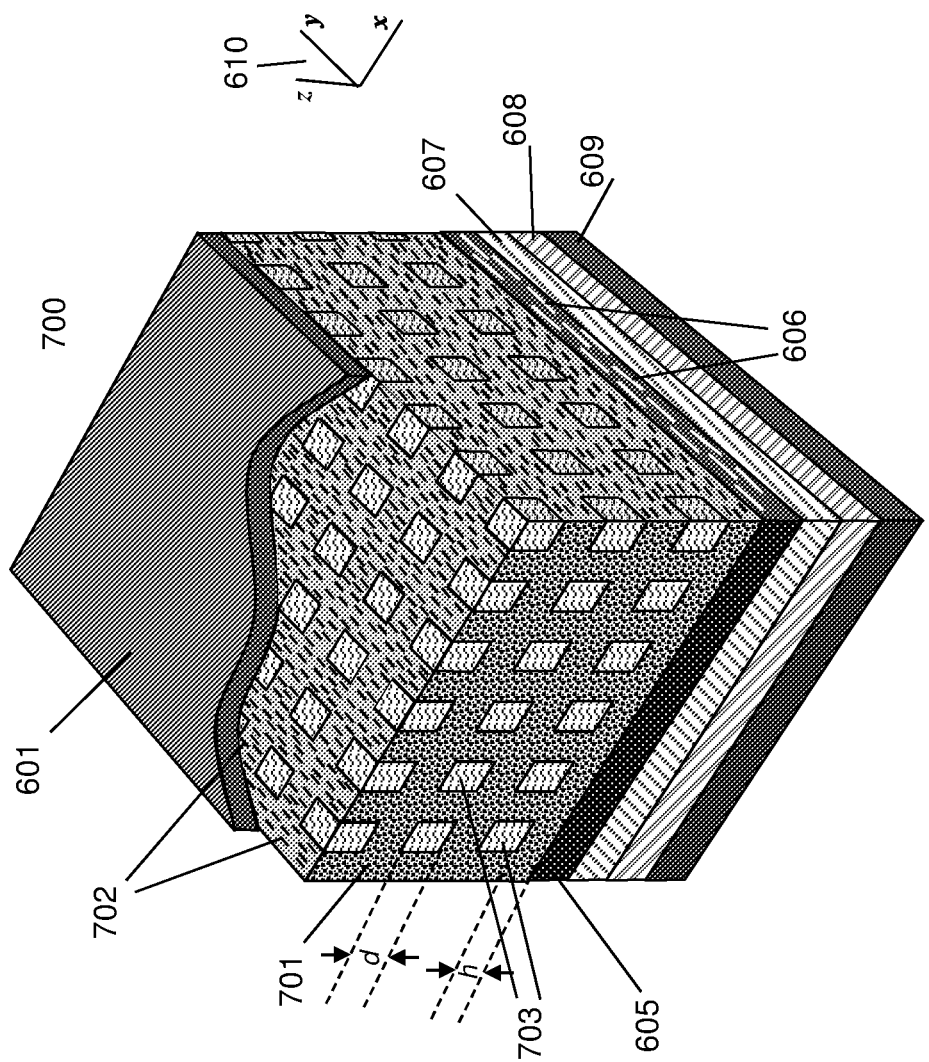
FIG. 7, shows in perspective view and section, an electroluminescent device according to the present invention incorporating a regular three-dimensional matrix array of zones of liquid crystalline material surrounded by and interspersed in isotropic material.

By analogy with devices 300 and 500, layer 602 in device 600 can be further modified to introduce a three-dimensional grating in that layer. This embodiment is portrayed in FIG. 7. Amorphous inclusions 703 in liquid crystalline electron transporting layer 701 are now cubic in shape creating refractive index modulation in the x, y, and z directions. This may be particularly advantageous the light emitting molecules in layer 605 emit light isotropically.

The invention claimed is:

1. A non-coherent light emitting device comprising at least one organic light emitting or organic charge transporting layer and a structure providing a Bragg grating associated with the light emitting layer wherein the at least one organic light emitting or organic charge transporting layer comprises alternating zones of isotropic and liquid crystalline material.

2. The device of claim 1 wherein the at least one organic light emitting or organic charge transporting layer comprises a liquid crystalline material having uniformly aligned molecular cores.

3. The device of claim 2 wherein the alignment of the molecular cores is in a plane of the light emitting layer.

4. The device of claim 2 wherein the alignment of the molecular cores is parallel to zone boundaries in the layer in which they are contained.

5. The device of claim 1 in which at least one of the isotropic or liquid crystalline zones is a crosslinked polymer.

6. The device of claim 1 in which the at least one organic light emitting or organic charge transporting layer comprises a liquid crystalline material, when uniformly aligned, is dichroic in nature with a dichroic ratio in excess of 2:1.

7. The device of claim 1 in which the alternating zones of isotropic and liquid crystalline material have a uniform period of alternation over a distance equivalent to at least 20 zones.

8. The device of claim 7 in which the uniform period of alternation is within $\pm 20\%$ of $k\lambda/2$, where $\lambda$ is the wavelength of maximum emission intensity of the light emitting material of the light emitting device.

9. The device of claim 7 in which light emission in the plane of the device is suppressed by the combination of dichroism in the emitting material and the suppression of light propagation modes through the medium of alternating isotropic and liquid crystalline zones.

10. A non-coherent light emitting device comprising at least one organic light emitting or organic charge transporting layer wherein the aforesaid light emitting or charge transporting layer comprises a regular two-dimensional matrix array of areas of liquid crystalline material surrounded by an area of isotropic material.

11. The device of claim 10 in which the areas of liquid crystalline material are square or rectangular in shape.

12. The device of claim 10 in which the areas of liquid crystalline material are in the shape of rhombuses or parallelograms.

13. The device of claim 10 in which the areas of liquid crystalline material are circular or oval in shape.

14. The device of claim 10 in which the two-dimensional matrix is a square matrix.

15. The device of claim 10 in which the two-dimensional matrix is an octagonal matrix.

16. The device of claim 10 in which the regular two-dimensional matrix is extant in a plane parallel to the plane of the device.

17. The device of claim 10 in which the regular two-dimensional matrix is extant in a plane perpendicular to the plane of the device.

18. The device of claim 10 in which the liquid crystalline material, when uniformly aligned, is dichroic in nature with a dichroic ratio in excess of 2:1.

19. The device of claim 10 in which the alternation between isotropic and liquid crystalline material in the regular two-dimensional matrix interacts with the pattern of material layers in the light emitting device so as to localise light in the light emitting layer of the device.

20. The device of claim 10 in which light emission in the plane of the device is suppressed by the combination of dichroism in the emitting material and the suppression of light propagation modes through the medium of alternating isotropic and liquid crystalline areas.

21. The device of claim 10 in which the alternation between isotropic and liquid crystalline material along an axis in the plane of the two-dimensional matrix is within $\pm 20\%$ of $k\lambda/2$, where $\lambda$ is the wavelength of maximum emission intensity of the light emitting material of the light emitting device.

22. A non-coherent light emitting device comprising at least one organic light emitting or organic charge transporting layer wherein the aforesaid light emitting or charge transporting layer comprises a regular three-dimensional matrix array of zones of liquid crystalline material surrounded by and interspersed in isotropic material.

23. The light emitting device of claim 22 in which the zones take the form of cubes, rectangular cuboids, or parallelepipeds.

24. The light emitting device of claim 22 in which the zones take the form of cylinders, elliptic cylinders, spheres or ellipsoids.

25. The light emitting device of claim 22 in which the matrix array forms either a simple cubic, a face-centered cubic or a hexagonal close-packed matrix lattice.

26. The device of claim 22 in which the liquid crystalline material, when uniformly aligned, is dichroic in nature with a dichroic ratio in excess of 2:1.

27. The device of claim 22 in which the alternation between isotropic and liquid crystalline material in the regular three-dimensional matrix interacts with the pattern of material layers in the light emitting device so as to localise light in the light emitting layer of the device.

28. The device of claim 22 in which light emission in the plane of the device is suppressed by the combination of dichroism in the emitting material and the suppression of light propagation modes through the medium of alternating isotropic and liquid crystalline areas.

29. The device of claim 10 in which the alternation between isotropic and liquid crystalline material along an axis through the two-dimensional matrix is within ±20% of $k\lambda/2$, where $\lambda$ is the wavelength of maximum emission intensity of the light emitting material of the light emitting device.

30. A method of manufacturing a layered electroluminescent device, which method comprises depositing an organic liquid crystalline emitter material as a layer, uniformly aligning the liquid crystal molecules' rod-like molecular cores within the layer, exposing selected regions of the aligned layer below the liquid crystal to isotropic phase transition temperature of the material to phase setting conditions in order to set the phase of the selected exposed regions, heating the layer comprising phase set regions above the material's liquid crystal to isotropic phase transition temperature to a second exposure to phase setting conditions.

* * * * *